(12) United States Patent
Kamei

(10) Patent No.: US 7,733,701 B2
(45) Date of Patent: *Jun. 8, 2010

(54) READING NON-VOLATILE STORAGE WITH EFFICIENT SETUP

(75) Inventor: Teruhiko Kamei, Kanagawa (JP)

(73) Assignee: SanDisk Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/435,127

(22) Filed: May 4, 2009

(65) Prior Publication Data

US 2009/0213658 A1 Aug. 27, 2009

Related U.S. Application Data

(62) Division of application No. 11/305,588, filed on Dec. 16, 2005, now Pat. No. 7,545,675.

(51) Int. Cl.
G11C 16/04 (2006.01)

(52) U.S. Cl. .................................. 365/185.18
(58) Field of Classification Search ............ 365/185.18, 365/185.17, 185.24
See application file for complete search history.

(56) References Cited

U.S. PATENT DOCUMENTS

| | | |
|---|---|---|
| 5,568,420 A | 10/1996 | Lim |
| 5,991,193 A | 11/1999 | Gallagher et al. |
| 6,044,017 A | 3/2000 | Lee |
| 6,046,933 A | 4/2000 | Nobukata |
| 6,154,391 A | 11/2000 | Takeuchi et al. |
| 6,522,583 B2 | 2/2003 | Kanda et al. |
| 6,646,300 B2 | 11/2003 | Ishii et al. |
| 6,859,397 B2 | 2/2005 | Lutze et al. |

(Continued)

FOREIGN PATENT DOCUMENTS

EP 0566306 A2 10/1993

(Continued)

OTHER PUBLICATIONS

Notice of Allowance and Fee(s) Due dated Mar. 13, 2007, U.S. Appl. No. 11/303,193.

(Continued)

*Primary Examiner*—Hoai V Ho
*Assistant Examiner*—Anthan T. Tran
(74) *Attorney, Agent, or Firm*—Vierra Magen Marcus & DeNiro LLP

(57) ABSTRACT

A process for reading data (including verifying during programming) from a selected non-volatile storage elements of a group (e.g., NAND string) of non-volatile storage elements includes maintaining an intermediate voltage as a control gate voltage for an unselected non-volatile storage element and subsequently changing the control gate voltage for the unselected non-volatile storage element from the intermediate voltage to a read enable voltage. The control gate voltage for the selected non-volatile storage element is raised from a standby voltage (which is different than the intermediate voltage) to a read compare voltage. While the control gate for the selected non-volatile storage element is at the read compare voltage and the control gate for the unselected non-volatile storage element is at the read enable voltage, the state of the selected non-volatile storage element is sensed to determine information about the data stored in the selected non-volatile storage element.

20 Claims, 9 Drawing Sheets

U.S. PATENT DOCUMENTS

| | | | |
|---|---|---|---|
| 7,369,437 B2 * | 5/2008 | Kamei | 365/185.17 |
| 2005/0213385 A1 * | 9/2005 | Hosono et al. | 365/185.17 |
| 2007/0140011 A1 | 6/2007 | Kamei | |

FOREIGN PATENT DOCUMENTS

| | | | |
|---|---|---|---|
| EP | 0626645 | A2 | 11/1994 |
| EP | 0991075 | A1 | 4/2000 |
| EP | 1274096 | A2 | 1/2003 |
| EP | 1538633 | | 6/2005 |

OTHER PUBLICATIONS

Notice of Allowance and Fee(s) Due dated Aug. 10, 2007, U.S. Appl. No. 11/303,193.

Notice of Allowance and Fee(s) Due dated Dec. 31, 2007, U.S. Appl. No. 11/303,193.

PCT Search Report dated May 22, 2007, PCT Application No. PCT/US2006/046961.

International Preliminary Report on Patentability dated Jun. 26, 2008, PCT Application No. PCT/US2006/046961.

European Office Action dated Oct. 5, 2009 in European Application No. 06845066.7-1233.

Taiwanese Office Action dated Jul. 20, 2009 in Taiwanese Application No. 095147162.

Korean Office Action dated Feb. 18, 2010 in Korean Application 7017367/2008.

English Translation of Korean Action dated Feb. 18, 2010 in Korean Application No. 7017367/2008.

* cited by examiner

READING NON-VOLATILE STORAGE WITH EFFICIENT SETUP

PRIORITY DATA

This application is a divisional of U.S. patent application Ser. No. 11/305,588, entitled "Reading Non-Volatile Storage With Efficient Setup," filed on Dec. 16, 2005, now U.S. Pat. No. 7,545,675.

CROSS REFERENCE

This application is related to U.S. Pat. No. 7,369,437 entitled "System For Reading Non-Volatile Storage With Efficient Setup,".

BACKGROUND OF THE INVENTION

1. Field of the Invention

The technology described herein relates to non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397 and U.S. Pat. No. 6,917,542; both of which are incorporated herein by reference in their entirety.

Typically, the program voltage applied to the control gate is applied as a series of pulses. The magnitude of the pulses is increased with each pulse by a predetermined step size. In the periods between the pulses, verify operations are carried out. That is, the programming level of each memory cell being programmed in parallel is read between each programming pulse to determine whether it is equal to or greater than a verify level to which it is being programmed. One means of verifying the programming is to test conduction between the memory cell's source and drain at a specific compare point.

Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the memory cell to an appropriate value, the memory cell can be made to either conduct or not conduct current for a given set of applied voltages. Thus, by determining whether a memory cell conducts current at a given set of voltages, the state of the memory cell can be determined.

Flash memory cells are erased by raising the p-well to an erase voltage (e.g. 20 volts) and grounding the word lines of a selected block (or other unit) of memory cells. The source and bit lines are floating. Erasing can be performed on the entire memory array, separate blocks, or another unit of cells. Electrons are transferred from the floating gate to the p-well region and the threshold voltage becomes negative.

Some flash memory systems use group the memory cells into an array, organized so that a set of bit lines and word lines can be used to address a particular memory cell. In one example, the memory cells are grouped into a set of NAND strings. Each NAND string includes multiple transistors in series between two select gates (a drain side select gate SGD and a source side select gate SGS). In typical read and verify operations for NAND flash memory, the select gates (SGD and SGS) are raised to approximately 3 volts and the unselected word lines are raised to a read pass (or enable) voltage (e.g. 5 volts) to make the transistors operate as pass gates. The selected word line is connected to a compare voltage, a level of which is specified for each read or verify operation in order to determine whether a threshold voltage of the concerned memory cell has reached such level. The source and p-well are at zero volts. The selected bit lines are pre-charged to a level of, for example, 0.7V. If the threshold voltage is higher than the verify or read level applied to the selected word line, the potential level of the concerned bit line maintains the high level because of the non-conductive memory cell. On the other hand, if the threshold voltage is lower than the read or verify level, the potential level of the concerned bit line decreases to a low level, for example less than 0.5V, because of the conductive memory cell. The state of the memory cell is detected by a sense amplifier that is connected to the bit line.

Typically, in between read operations and in between program and verify operations the word lines are at 0 volts. The unselected word lines are raised to the read pass voltage at the same time as the selected word line is raised to the read compare voltage. Because the read pass voltage is generally much larger than the read compare voltage, the word lines are close together and the word lines can be relatively long, coupling noise can appear on the selected word line when it is raised to the read compare voltage while the unselected word lines are raised to the read pass voltage. This coupling initially raises the voltage of the selected word line; however, the raised voltage will dissipate over time so that the selected word line settles at the intended read compare voltage. To avoid errors, some systems will need to delay the read process in order to wait for the selected word line to settle at the intended read compare voltage. This waiting slows down the reading and/or verification process.

One proposal to remedy the coupling issue described above is to slow down the ramp-up of the read pass voltage on the unselected word lines. However, this solution also slows down the reading and verification process.

Another proposal is to reduce the capacitive coupling of the word lines. However, to reduce the capacitive coupling of the word lines more expensive materials need to be used or die size needs to be increased in order to increase space in between word lines.

Another proposal is to maintain the word lines at the read pass voltage in between read operations and in between program and verify operations. Therefore, the unselected word lines would not need to be ramped up during a read process. A problem with this approach is that to move the word lines to the read pass voltage from other voltages using during the programming process (or other processes) requires a charge pump or other circuit to sink a large amount of current to bring down the word lines to the read pass voltage. For example, during a program-verify process, the word lines must move from a boosting voltage (e.g. 10 volts) to the read pass voltage (e.g., approximately 5 volts). Some charge pumps and other circuit typically found on flash memory device today cannot efficiently sink current to bring the voltage down to any specific voltages except for standby voltage. New circuits for more complicated sequence and voltage detection control may need to be added that itself will require additional space on the device.

SUMMARY OF THE INVENTION

The technology described herein pertains to a system for reading data (including verifying during programming) from one or more selected non-volatile storage elements of a group (e.g., NAND string) of non-volatile storage elements. The system maintains an intermediate voltage as a control gate voltage for an unselected non-volatile storage element and subsequently changes that control gate voltage for the unselected non-volatile storage element from the intermediate voltage to a read enable voltage. The control gate voltage for a selected non-volatile storage element is raised from a standby voltage (which is different than the intermediate voltage) to a read compare voltage. While the control gate for the selected non-volatile storage element is at the read compare voltage and the control gate for the unselected non-volatile storage element is at the read enable voltage, the state of the selected non-volatile storage element is sensed to determine information about the data stored in the selected non-volatile storage element.

One embodiment includes maintaining an intermediate voltage as a control gate voltage for an unselected non-volatile storage element, changing the control gate voltage for the unselected non-volatile storage element from the intermediate voltage to a read enable voltage, maintaining a read voltage as a control gate voltage for a selected non-volatile storage element while the control gate voltage for the unselected non-volatile storage element is at the read enable voltage, and sensing information about data stored in the selected non-volatile storage element in response to the read voltage as the control gate voltage for the selected non-volatile storage element.

One embodiment includes raising a control gate voltage for an unselected non-volatile storage element from an intermediate voltage to a read enable voltage, raising a control gate voltage for a selected non-volatile storage element from a standby voltage to a read voltage while raising the control gate voltage for the unselected non-volatile storage element from the intermediate voltage to the read enable voltage, and sensing information about data stored in the selected non-volatile storage element in response to the read voltage.

In one example implementation, a non-volatile storage system includes a plurality of non-volatile storage elements, word lines in communication with the plurality of non-volatile storage elements, bit lines in communication with the plurality of non-volatile storage elements, and one or more managing circuits in communication with the plurality of non-volatile storage elements. The one or more managing circuits maintain an intermediate voltage on unselected word lines, change the unselected word lines from the intermediate voltage to a read enable voltage, maintain a read voltage on a selected word line while the unselected word lines are at the read enable voltage, and sense information about data stored in a selected non-volatile storage element connected to the selected word line in response to the read voltage on the selected word line.

DETAILED DESCRIPTION

Figure 1:
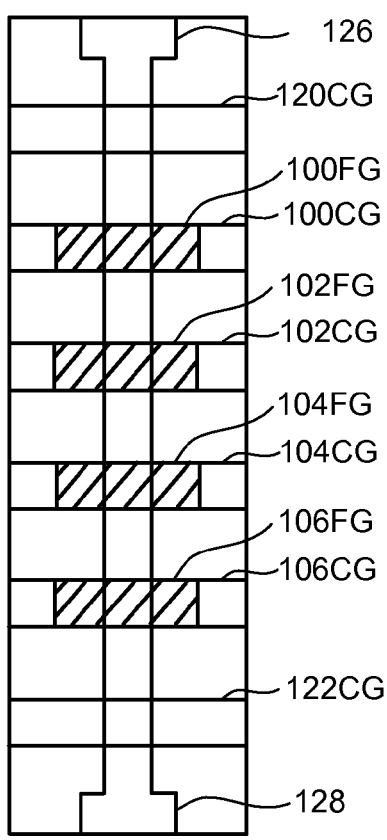
FIG. 1 is a top view of a NAND string.
Figure 2:
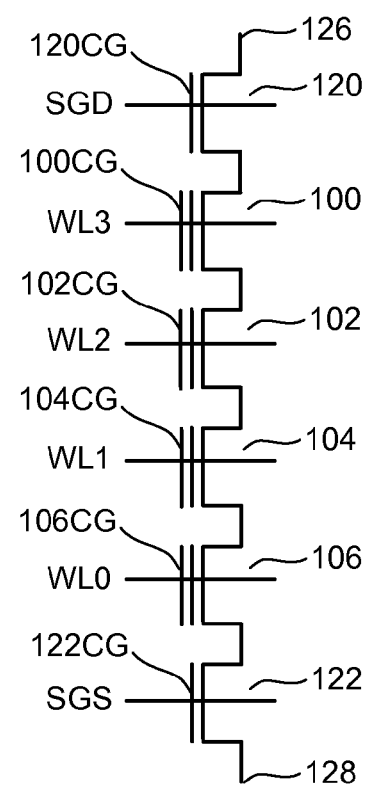
FIG. 2 is an equivalent circuit diagram of the NAND string.

One example of a non-volatile memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 connects the NAND string to bit line contact 126. Select gate 122 connects the NAND string to source line contact 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
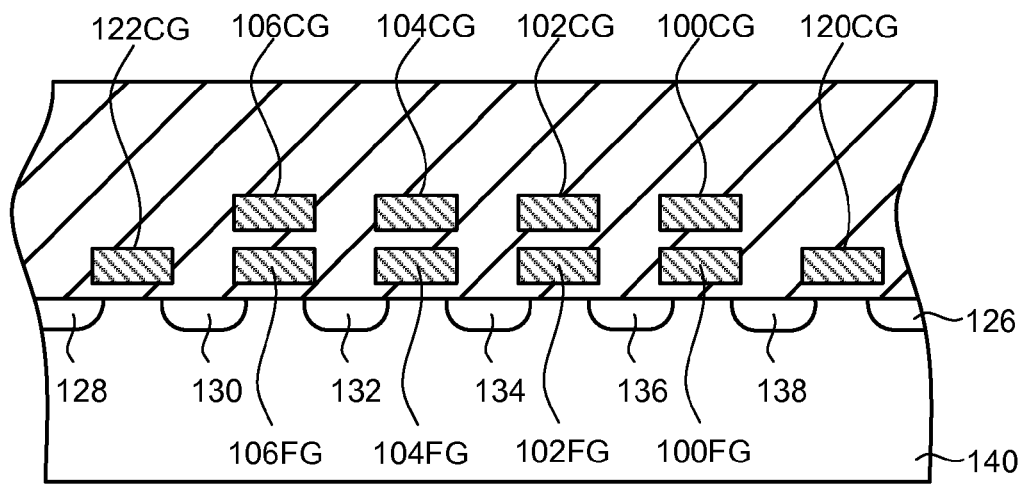
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell can be divided into two ranges, which are assigned logical data "1" and "0." In one example of a NAND flash memory, the threshold voltage is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states (known as a multi-state memory cell), thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of flash memory, as well as EEPROMs and other types of non-volatile memory can also be used.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Non-volatile Semiconductor Memory Technology," edited by William D. Brown and Joe E. Brewer, IEEE Press, 1998, incorporated herein by reference, are also described in that section to be applicable to dielectric charge-trapping devices.

Figure 4:
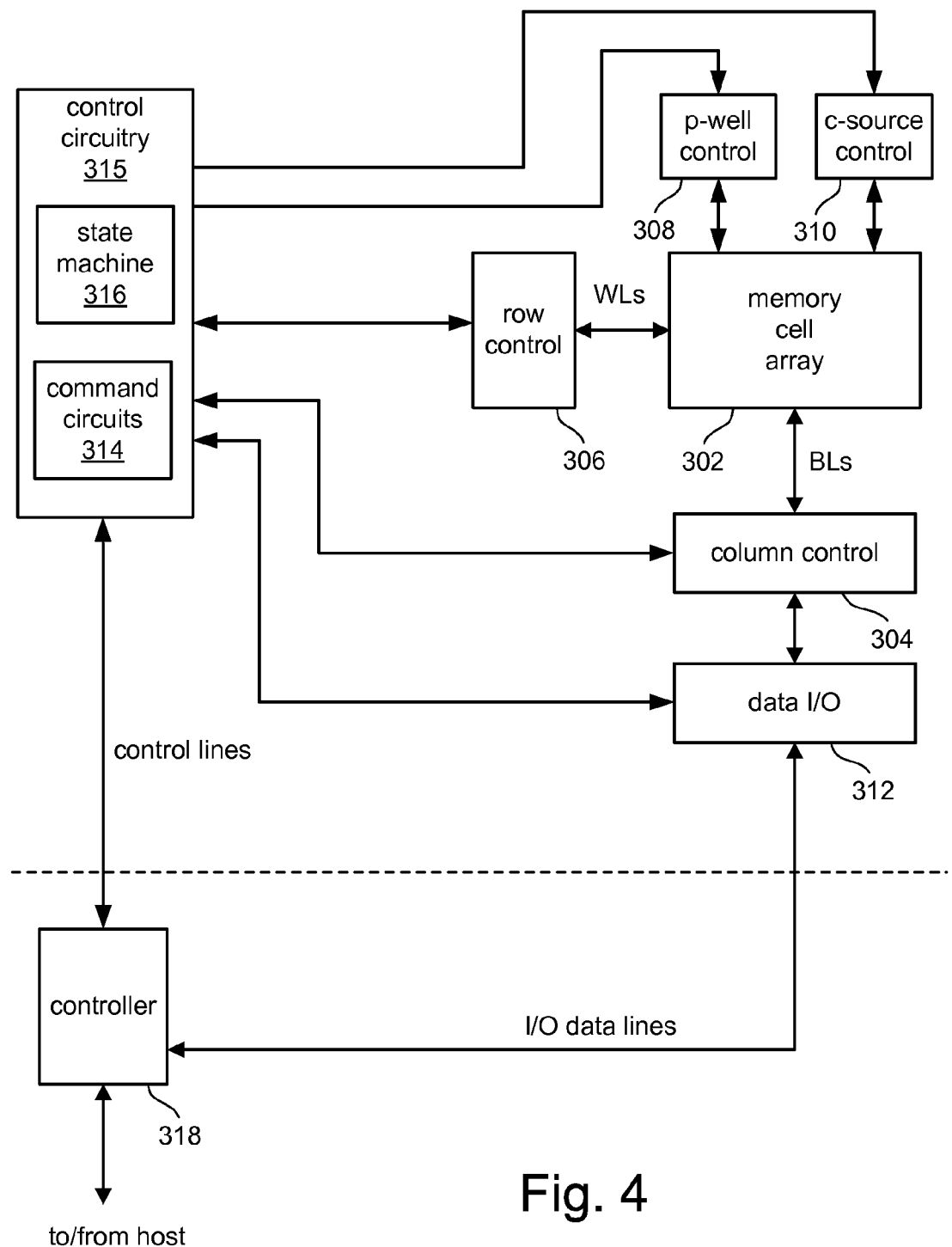
FIG. 4 is a block diagram of one embodiment of a non-volatile memory system.

FIG. 4 is a block diagram of one embodiment of a flash memory system that can implement the technology described herein. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages and to apply program voltages. C-source control circuit 310 controls a common source line (labeled as "Source" in FIG. 5) connected to the memory cells. P-well control circuit 308 controls the p-well voltage and can provide the erase voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory device of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL. In some embodiments, state machine 316 is responsible for managing the programming process, verify process and the read process, including the processes depicted in the flow charts described below.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 4 can be combined. In various designs, one or more of the components of FIG. 4 (alone or in combination), other than memory cell array 302, can be thought of as a managing circuit. For example, one or more managing circuits may include any one of or a combination of a command circuit, a state machine, a row control circuit (including one or more decoders), a column control circuit (including one or more decoders), a well control circuit, a source control circuit or a data I/O circuit.

In one embodiment, memory cell array 302 includes NAND flash memory. In other embodiments, other types of flash memory and/or other types of non-volatile storage can be used, including those described above as well as others not described above.

Figure 5:
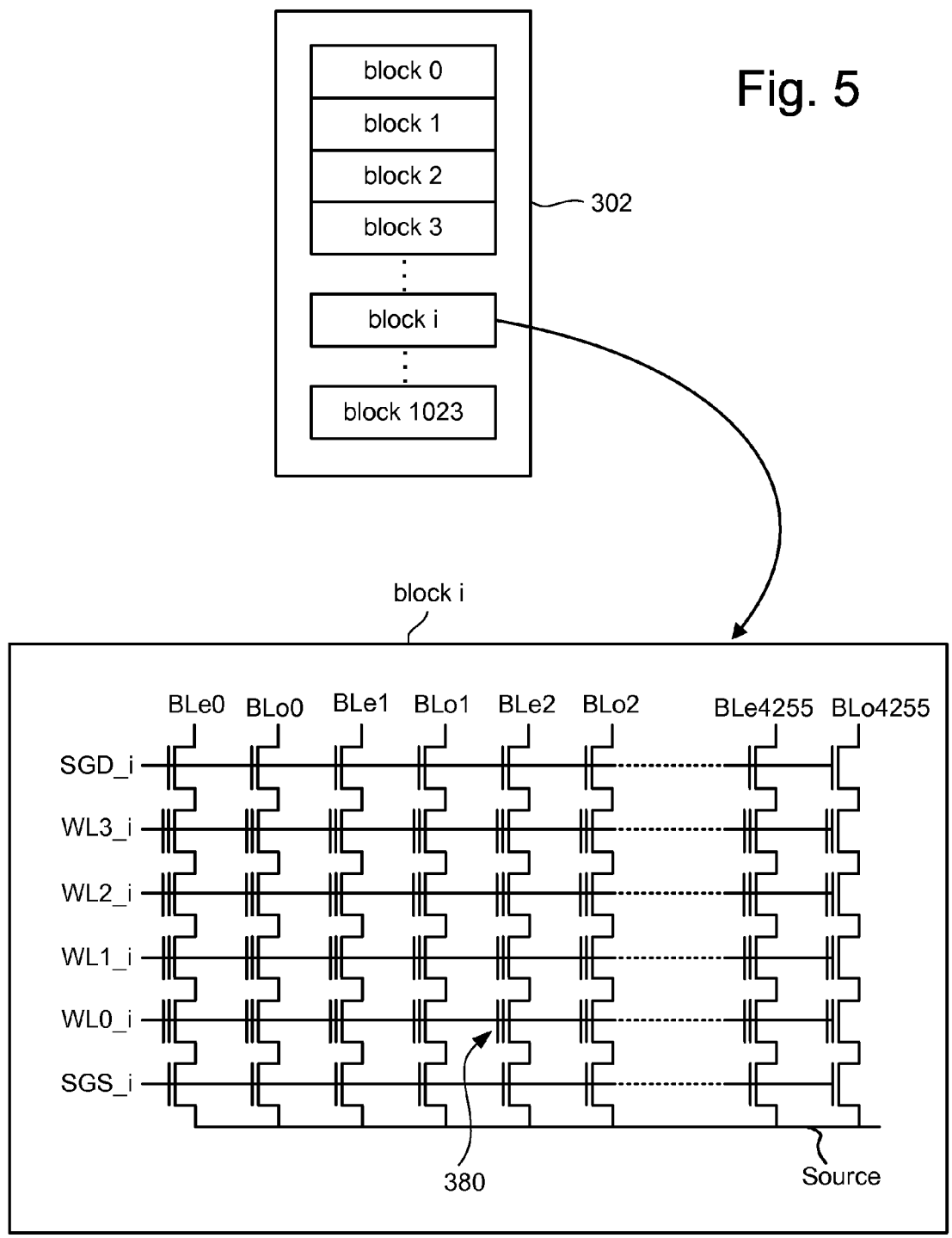
FIG. 5 is a block diagram of one embodiment of a non-volatile memory array.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 4 and 5 can also be used to implement the present invention. For example, in one embodiment the bit lines are not divided into odd and even bit lines so that all bit lines are programmed and read concurrently (or not concurrently).

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

Figure 6:
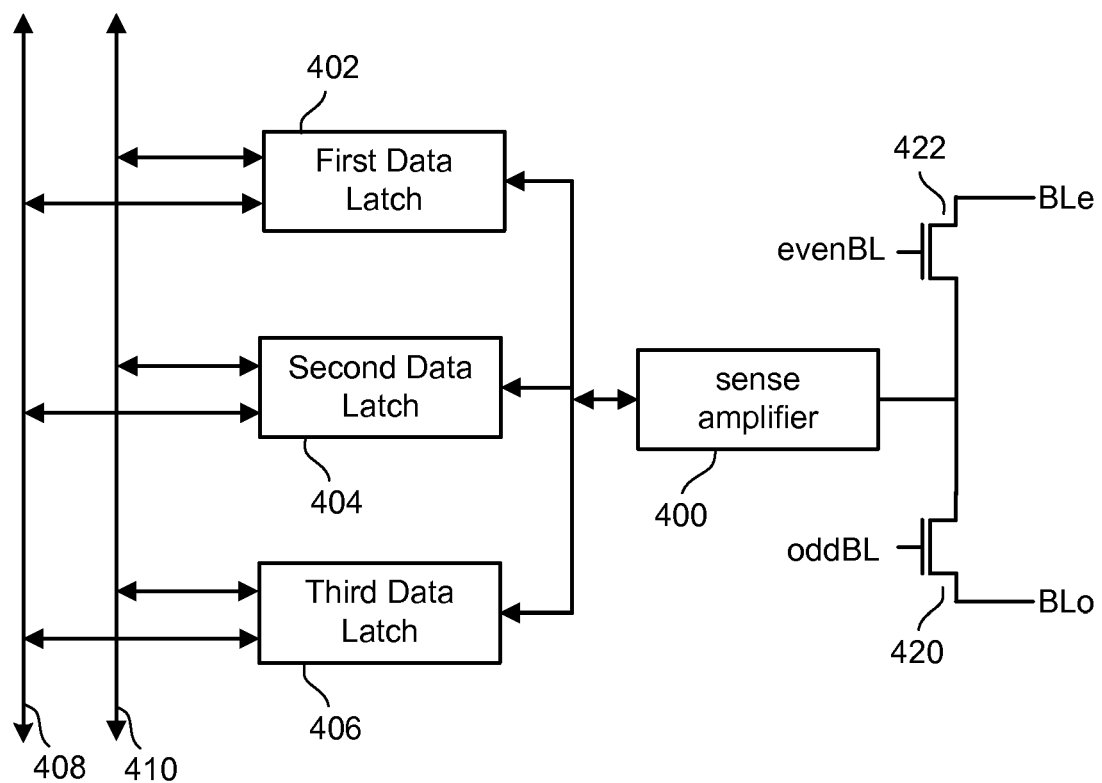
FIG. 6 is a block diagram depicting one embodiment of a sense amplifier and latches.

During a read or verify operation, the state of a memory cell is detected by a sense amplifier that is connected to the bit line. FIG. 6 depicts a portion of column control circuit 304 of FIG. 4 that includes a sense amplifier. Each pair of bit lines (e.g. BLe and BLo) is coupled to a sense amplifier 400. The sense amplifier is connected to three data latches: first data latch 402, second data latch 404 and third data latch 406. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 6. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

A memory system will typically be provided with an external power supply that is commonly referred to as Vcc. In some embodiments, Vcc may vary between 2.7 to 3.6 volts. A memory system may also receive a ground signal (approximately 0 volts) commonly referred to as Vss. Some memory systems will create an internal power supply that is referred to as Vdd. Some or all of the components of the memory system will use Vdd for power. In one embodiment, Vdd is a regulated and stabilized version of Vcc so that Vdd is regulated to 2.7 volts regardless of whether Vcc varies. In other embodiments, other values for Vdd can be used. In some embodiments, the memory system will not have an internal power supply Vdd; therefore, Vcc will be used internally for power by the components of the memory system.

During operation of the memory system, various voltage levels will be applied to the word lines. To create these various voltage levels, a charge pump can be used. In one embodiment, a charge pump will create various voltages from Vdd. In other embodiments, Vcc or other signals can be provided as an input to the charge pump.

Figure 7:
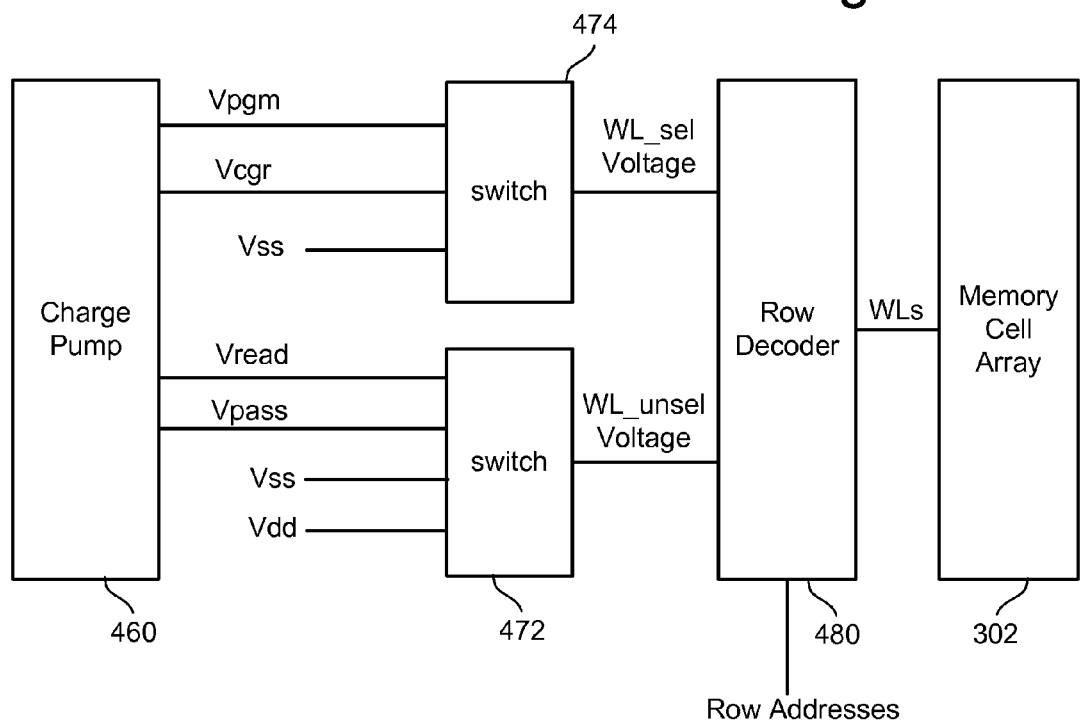
FIG. 7 is a block diagram of one embodiment of charge pump and switching circuits.

FIG. 7 is a block diagram depicting one embodiment of a charge pump and selection circuitry. Charge Pump circuit 460 can be comprised of one or more charge pumps. Technology for implementing charge pumps is well known in the art. Charge Pump circuit 460 is depicted to generate at least four signals Vpgm, Vcgr, Vread and Vpass. The signal Vpgm is the program voltage signal which is applied to the control gates (via the selected word line) of the memory cells selected for programming. The signal Vcgr (sometimes called the read compare voltage or read voltage) is the control gate voltage for the selected memory cells being read. The signal Vread is the read pass (or enable) voltage. When Vread is applied to the control gates of the memory cells in the NAND string, those memory cells receiving Vread will turn on and act as pass gates to enable reading of the selected memory cells. The signal Vpass is used as a boosting signal during the programming process. Vpass is supplied to the control gates of those memory cells on a NAND string that is not selected for programming so that the channel of unselected NAND string will be boosted to a higher voltage to prevent programming of unselected memory cells. This boosting prevents program disturb, which is the unintentional programming of unselected memory cells. Program disturb is well known to the art. More information about program disturb can be found in U.S. Pat. No. 6,859,397, incorporated herein by reference in its entirety.

FIG. 7 shows that two outputs of charge pump circuit 460, Vpgm and Vcgr, are provided to switch 474. Switch 474 also receives Vss. Based on signals received from the state machine, switch 474 will select one of its three input voltages (either Vpgm, Vcgr, or Vss) and provide that selected voltage as the selected word voltage to Row Decoder 480. Two of the outputs from charge pump circuit 460, Vread and Vpass, are provided to switch 472. The signals Vss and Vdd are also provided to switch 472. Based on signals received from the state machine, switch 472 will choose one of the four input voltages (Vread, Vpass, Vss or Vdd) to be provided as the unselected word line voltage to row decoder 480. Row decoder 480 will receive one or more addresses from the state machine. Based on the address received from the state machine, row decoder 480 will determine which word lines will receive the selected word line voltage (WL_sel) and which word lines will receive the unselected word line voltage (WL_unsel). Row Decoder 480 will provide the appropriate voltages on the appropriate word lines to memory cell array 302. As discussed below, in one embodiment, the switches and row decoder are controlled by the state machine. In other embodiments, the switches and decoders can be controlled by other components. In one embodiment, charge pump 460, switch 472, switch 474 and row decoder 480 are part of row control 306 (see FIG. 4). In other embodiments, charge pump 460, switch 472, switch 474 and row decoder 480 can be part of other portions of the memory system.

Figure 8:
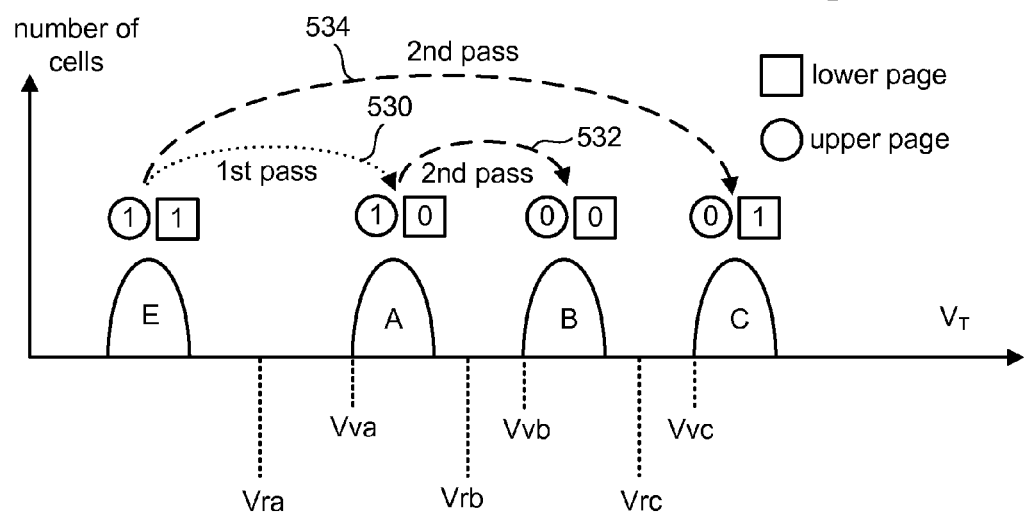
FIG. 8 depicts an example set of threshold voltage distributions.

FIG. 8 illustrates threshold voltage distributions for the memory cell array when each memory cell stores two bits of data. FIG. 8 shows a first threshold voltage distribution E for erased memory cells. Three threshold voltage distributions, A, B and C for programmed memory cells are also depicted. In one embodiment, the threshold voltages in the E distribution are negative and the threshold voltages in the A, B and C distributions are positive.

Each distinct threshold voltage range of FIG. 8 corresponds to predetermined values for the set of data bits. The specific relationship between the data programmed into the memory cell and the threshold voltage levels of the cell depends upon the data encoding scheme adopted for the cells. One example assigns "11" to threshold voltage range E (state E), "10" to threshold voltage range A (state A), "00" to threshold voltage range B (state B) and "01" to threshold voltage range C (state C). However, in other embodiments, other schemes are used.

FIG. 8 also shows three read reference voltages, Vra, Vrb and Vrc, for reading data from memory cells. By testing whether the threshold voltage of a given memory cell is above or below Vra, Vrb and Vrc, the system can determine what state the memory cell is in. For example, if a memory cell turns on when Vra, Vrb and Vrc are applied to its control gate, then the memory cell is in state E. If a memory cell turns on when Vrb and Vrc are applied to its control gate, but not when Vra is applied to its control gate, then the memory cell is in state A. If a memory cell turns on when Vrc is applied to its control gate, but not when Vra or Vrb are applied to its control gate, then the memory cell is in state B. If the memory cell does not turn on in response to Vra, Vrb or Vrc being applied to its control gate, then the memory cell is in state C.

FIG. 8 also shows three verify reference voltages, Vva, Vvb and Vvc. When programming memory cells to state A, the system will test whether those memory cells have a threshold voltage greater than or equal to Vva. A memory cell being programmed to state A will continue being programmed until its threshold voltage is at or above Vva. When programming memory cells to state B, the system will test whether the memory cells have threshold voltages greater than or equal to Vvb. A memory cell being programmed to state B will continue being programmed until its threshold voltage is at or above Vvb. When programming memory cells to state C, the system will determine whether memory cells have their threshold voltage greater than or equal to Vvc. A memory cell being programmed to state C will continue being programmed until its threshold voltage is at or above Vvc.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C.

FIG. 8 also illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the memory cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

The technology described herein can also be used with other programming schemes in addition to the ones described above. Some example of additional suitable program schemes can be found in U.S. Pat. No. 6,657,891, issued on Dec. 2, 2003 to Shibata et al., and U.S. patent application Ser. No. 11/099,133, Titled: "Compensating for Coupling During Read Operations of Non-Volatile Memory," Inventor Jian Chen, Filed Date: Apr. 5, 2005; both of which are incorporated herein by reference in their entirety.

Figure 9:
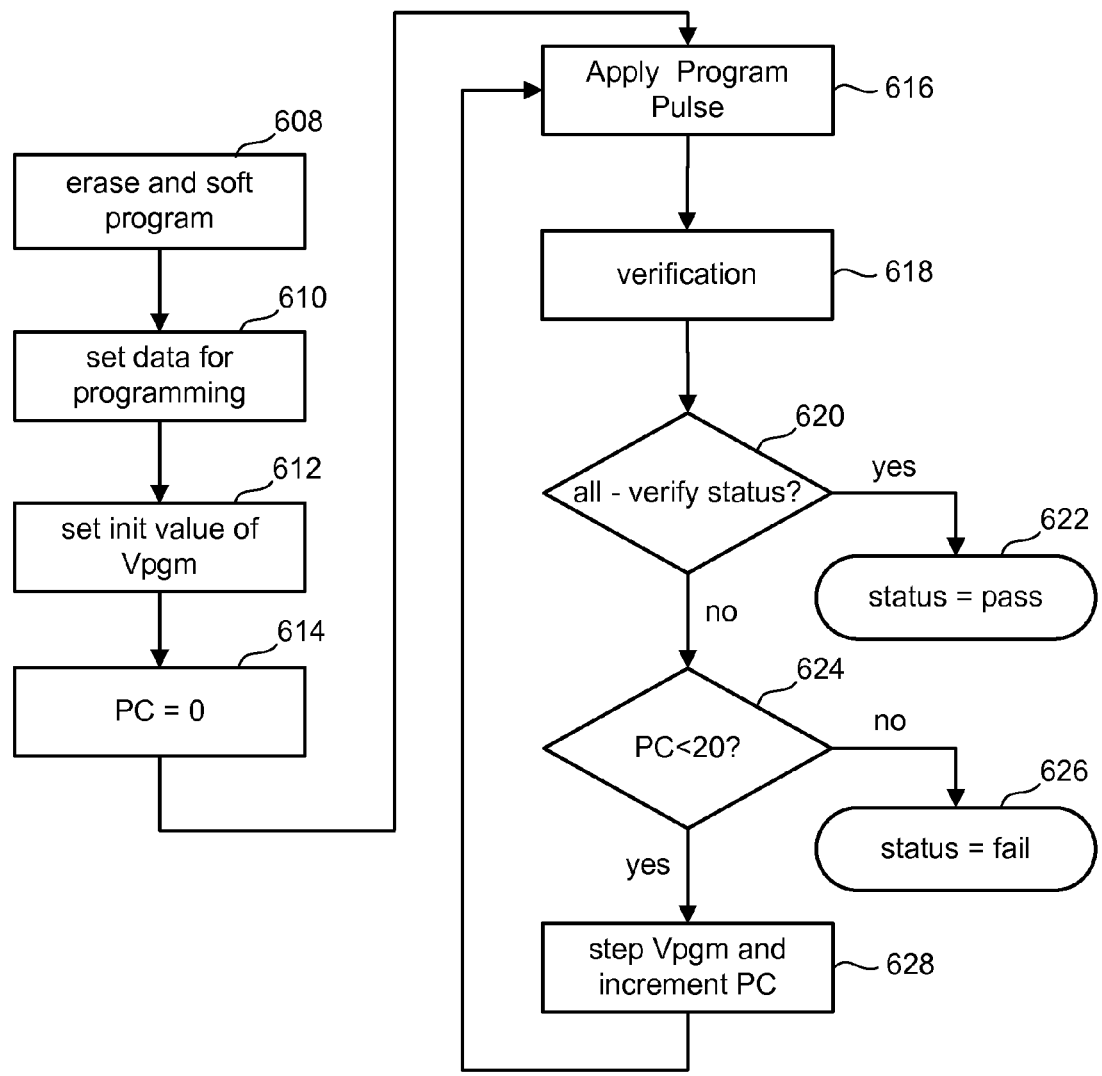
FIG. 9 is a flow chart describing one embodiment of a process for programming non-volatile memory.

FIG. 9 is a flow chart describing one embodiment of a high level process for programming. A request to program data can be received at the controller, the state machine, or another device. In response to that request, data (one or more bits of information) is written to the flash memory array 302 according to the process of FIG. 9.

In step 608, the memory cells to be programmed are erased. Step 608 can include erasing more memory cells than those to be programmed (e.g., in blocks or other units). For example, step 608 can include moving all memory cells in a block to state E. In some embodiments, step 608 also includes performing a soft programming process. During the erase process, it is possible that some of the memory cells have their threshold voltages lowered to a value that is below the distribution E. The soft programming process will apply program voltage pulses to memory cells so that their threshold voltages will increase to be within threshold voltage distribution E.

At step 610, a "data load" command is issued by controller 318 and input to command circuits 314, allowing data to be input to data input/output buffer 312. In step 610, address data designating the address for the appropriate portions of memory is input to row control 306 and data to be programmed is stored in the appropriate latches/registers in column control 304. In one embodiment, the process of FIG. 9 will be used to program one page of data. All of the memory cells being programmed are on the same word line. Each memory cell will have its own bit line and a set of latches associated with that bit line. These latches will store indications of the data to be programmed for the associated memory cell. In some embodiments, step 610 may include determining which word line is connected to the memory cells to be programmed. This word line is referred to as the selected word line. For example, looking at FIG. 5, if memory cell 380 is to be programmed, then word line WL0_i is the selected word line. Word lines that are not selected are referred to as unselected word lines. In some embodiments, a programming process will have one selected word line and multiple unselected word lines. In some embodiments, it may be possible to have multiple selected word lines.

In step 612, the magnitude of the first program pulse is set. In some embodiments, the voltage applied to the word lines during the programming process is a set of program pulses, with each pulse increasing in magnitude from the previous pulse by a step size (e.g., 0.2v-0.4v). In step 614, the program count (PC) will be set to initially be zero.

In step 616, a program pulse is applied to the appropriate word line(s). In step 618, the memory cells on that word line(s) are verified to see if they have reached the target threshold voltage level. If all the memory cells have reached the target threshold voltage level (step 620), then the programming process has completed successfully (status=pass) in step 622. If not all the memory cells have been verified, then it is determined in step 624 whether the program count PC is less than 20 (or another suitable value). If the program count is not less than 20, then the programming process has failed (step 626). If the program count is less than 20, than in step 628, the magnitude of program voltage signal Vpgm is incremented by the step size (e.g. 0.3v) for the next pulse and the program count PC is incremented. Note that those memory cells that have reached their target threshold voltage are locked out of programming for the remainder of the current programming cycle. After step 628, the process of FIG. 12 continues at step 616 and the next program pulse is applied as part of another iteration of the process of steps 616-628.

Figure 10:
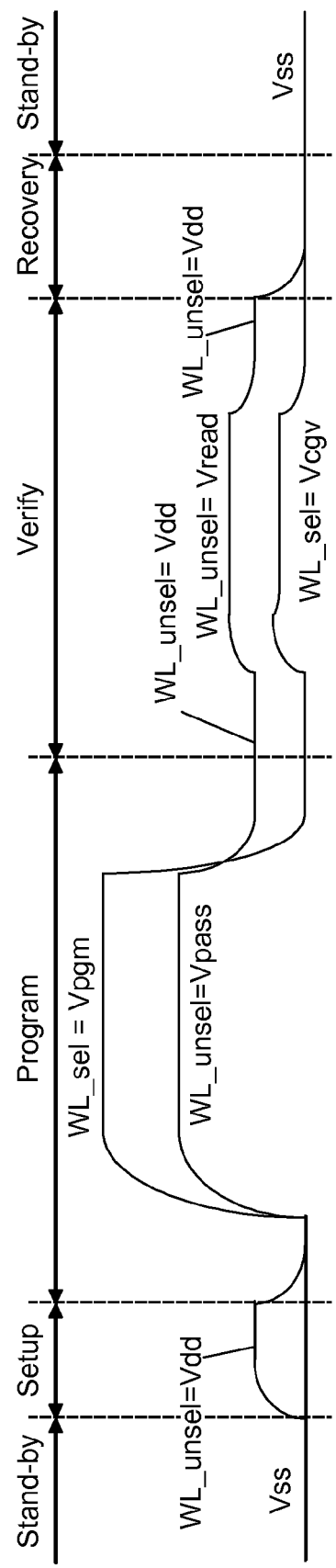
FIG. 10 is a signal diagram describing a portion of one embodiment of a programming process.

FIG. 10 is a signal diagram depicting the behavior of the selected word line (WL_sel) and the unselected word lines (WL_unsel) during one iteration of steps 616 and 618 of FIG. 9. The time period depicted in FIG. 10 is broken up into six periods: standby, setup, program, verify, recovery and standby (again). In both standby periods, the selected word line (WL_sel) and the unselected word lines (WL_unsel) are both at Vss, for example, at zero volts or near zero volts. In one embodiment Vss could be near zero volts because of various parasitics that prevent Vss from being exactly at zero volts. In the setup phase, (which is after the standby phase) the unselected word lines will be raised to Vdd to simplify the control circuitry so that the same voltage level can be used for a start level and end level for both program and read operations.

After the setup phase, the system enters the program phase. In the program phase, the unselected word lines (WL_unsel) are raised to Vpass, which can be approximately ten volts. The selected word line (WL_sel) is raised to the program voltage Vpgm. In one embodiment, the program voltage Vpgm is comprised of a set of program pulses, with each pulse increasing magnitude by a step size (e.g., 0.2 to 0.4 volts). In one embodiment, the initial voltage level for Vpgm is 12 volts. Other values can also be used with Vpgm. FIG. 10 depicts a single program pulse during the program phase. When the program pulse is complete, the selected word line (WL_sel) and the unselected word line (WL_unsel) are brought down to lower voltages. The selected word line (WL_unsel) is brought down to Vss while the unselected word lines (WL_unsel) are brought down to Vdd.

After the program phase, the system performs a verify phase. In the verify phase, the selected word line is raised from Vss to Vcgv. Vcgv (the compare voltage used during the verify process) is chosen based on the target threshold voltage distribution that the particular memory cell is being programmed to. The unselected word lines (WL_unsel) are raised to Vread, as discussed above. While the unselected word lines (WL_unsel) are at Vread and the selected word line (WL_sel) is at Vcgv, the appropriate bit line is pre-charged, provided a path to discharge, and sensed with a sense amplifier. Based on whether the bit line is discharged, it is determined whether the threshold voltage of the memory cell being verified has reached the level of Vcgv. After sensing, the selected word line (WL_sel) is lowered to Vss and the unselected word lines (WL_unsel) are lowered to Vdd. In the recovery phase (after the verify phase) the unselected word lines (WL_unsel) are brought down to Vss. More detail about the verify phase will be explained below when describing the read process. In one embodiment, the read process is used to perform verify for programming.

A charge pump is typically good at charging, but not as good at discharging because it is not designed to sink large current. If it is necessary to sink a large current, a discharging circuit would typically be needed. With the technology described herein that maintains the unselected word lines at Vdd prior to Vpass, there is no need for a discharging circuit because the circuit that manages and regulates Vdd is designed to supply a large current to a lot of components in the memory system. Therefore, it can effectively sink a large amount of current. The capacitance of Vdd is larger than the word line capacitances so Vdd can absorb change in the word lines without significant change to the voltage of Vdd. For example, the capacitances of unselected word lines tends to be in the hundreds of pico farads (e.g., 300 pF), while the capacitance of Vdd tends to be in the tens to hundreds of nano farads (e.g., 100 nF).

Figure 11:
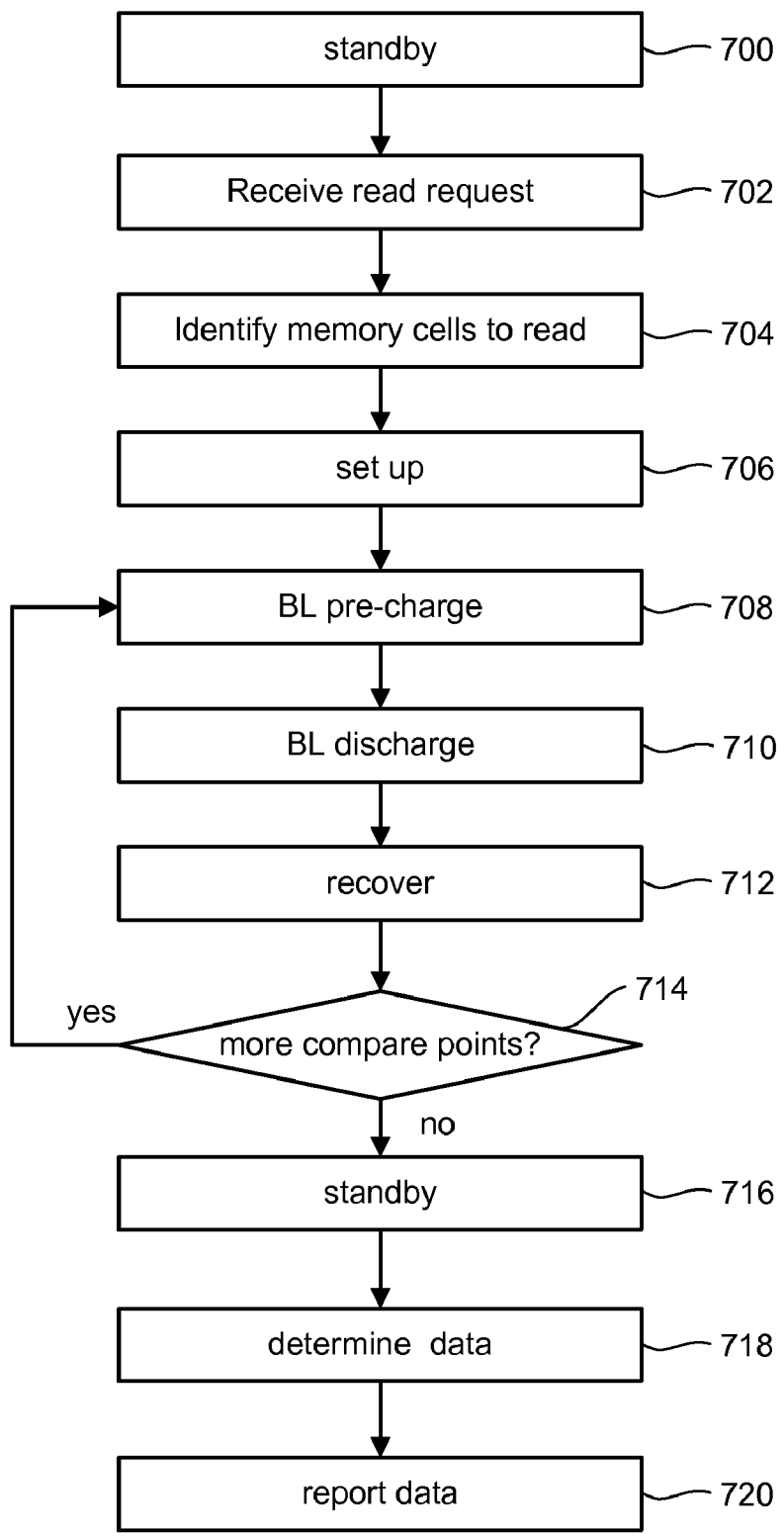
FIG. 11 is a flow chart describing one embodiment of a process for reading non-volatile memory.

FIG. 11 is a flow chart describing one embodiment of a process for reading data. The process of FIG. 11 may be performed in response to a request to read data. In step 700, the system is in standby mode. In step 702, the system receives a request to read data. This request can be from a host device, from the controller, from the state machine, or another entity. In step 704, the memory cells that need to be read are identified. This will include determining which pages need to be read, which word line will be selected word line and which word lines will be unselected word lines. In step 706, the read setup phase will be performed, at which time appropriate signals are set up for the read process. In step 708, the bit line pre-charge phase is performed. In step 710, the bit line is provided with a path to discharge. During step 710, a sense amplifier will be used to determine whether the bit line discharged. In step 712 the signals will be allowed to recover. More details of steps 706-712 will be provided below with respect to FIG. 12.

If the memory cell being read is a binary memory cell, then steps 708-712 are performed once for the particular Vcgr (or Vcgv). In one embodiment, Vcgr is equal to zero volts for binary memory cells. In embodiments where the memory cells are multi-state memory cells, then the read process will need to test for multiple read compare points, as explained above. Therefore, steps 708-712 will need to be performed multiple times for each read compare point. In step 714, the system determines whether there are more read compare points to test for. If so, the process loops back to step 708 and another iteration of steps 708-712 is performed. If all of the read compare points have been considered, then the device goes into standby mode in step 716. In step 718, the system determines the data stored in the selected memory cells. If the memory cell is a binary cell and the memory cell turned on, then it is assumed that the memory cell is an erased state. If the memory cell did not turn on, then the memory cell is in the program state. If the memory cell is a multi-state memory cell, then the system will determine the data stored in the memory cell based on whether the memory cell turned on or off in response to the various read compare points, as described above. The data determined in step 718 is reported in step 720. In one embodiment, the data could be reported to the state machine, the controller or the host.

Figure 12:
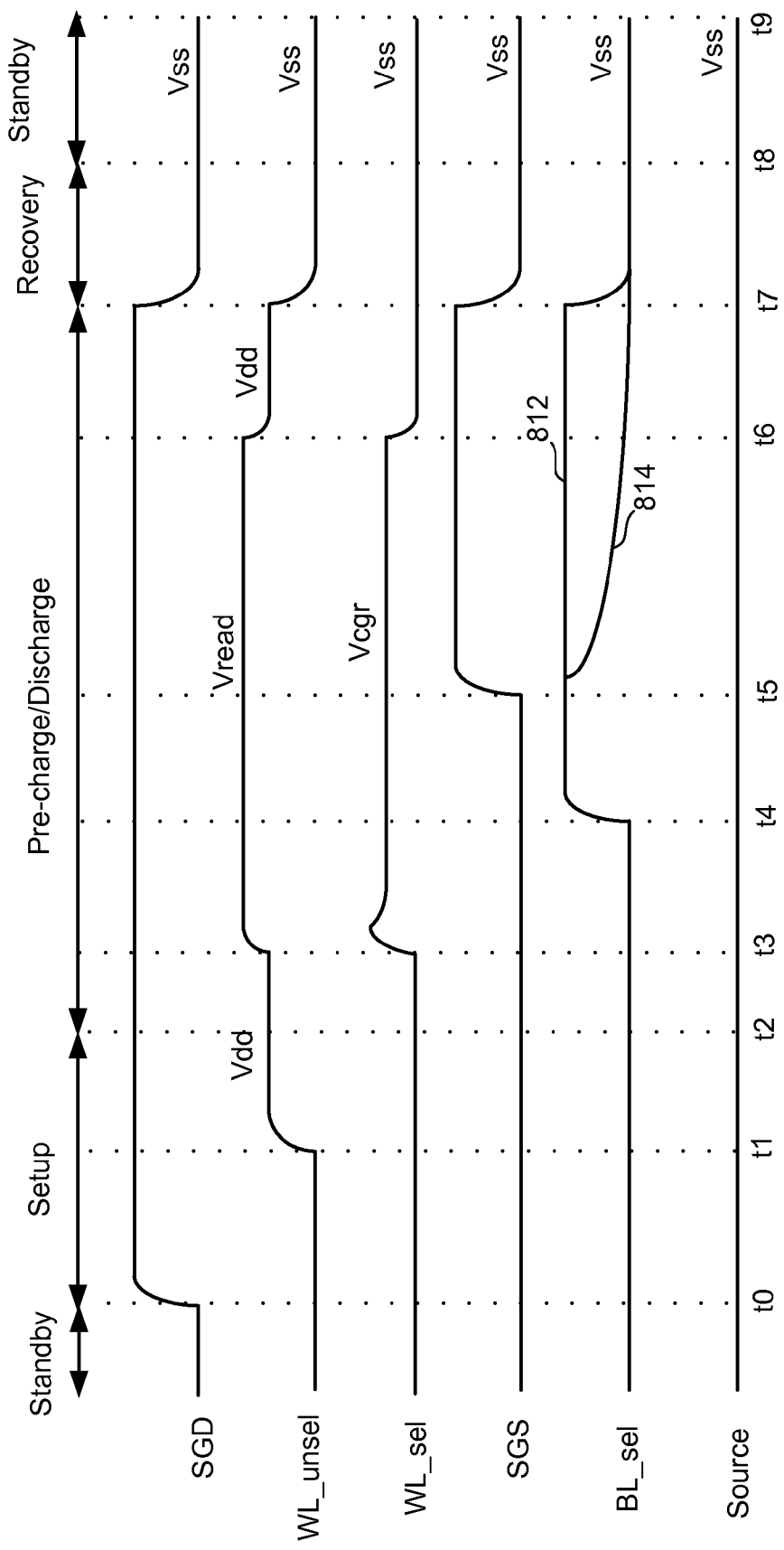
FIG. 12 is a signal diagram that depicts one embodiment of a process used when reading non-volatile memory.

FIG. 12 is a timing diagram depicting various signals during the process of FIG. 11. FIG. 12 shows the standby phase, setup phase, pre-charge/discharge phases, recovery phase and subsequent standby phase. The signals depicted include the control gate voltage (SGD) for the drain side select gate, the word line voltage for the unselected word lines (WL_unsel), the word line voltage for the selected word line (WL_sel), the control gate voltage for the source side select gate (SGS), the voltage on the bit line selected for programming (BL_sel), and the source line voltage (Source).

The first standby phase occurs prior to time t0, in which all the signals depicted are at Vss. The setup phase starts at time t0 and continues until time t2. At time t1, the unselected word lines are raised to Vdd. The pre-charge/discharge phase start at time t3 and continue to time t7. At time t3, the unselected word lines (WL_unsel) are raised from Vdd to Vread and the selected word line is raised from Vss to Vcgr. Because of capacitive coupling between the unselected word lines and the selected word line, the voltage on the selected word line is initially raised above Vcgr. Over time (following t3 and prior to t4), the word line voltage on the selected word line (WL_sel) settles down to Vcgr. At time t4, the selected bit line is pre charged. At time t5, the source side select gate is turned on by raising SGS to Vdd. This provides a path to dissipate the charge on the bit line. If the threshold voltage of the memory cell selected for reading is greater than Vcgr then the selected memory cell will not turn on and the bit line will not discharge, as depicted by signal line 812. If the threshold voltage in the memory cell selected for reading is below Vcgr then the memory cell selected for reading will turn on and the bit line voltage will dissipate, as depicted by curve 814. At some point after time t5 and prior to time t6 (as determined by the particular implementation), the sense amplifier will determine whether the bit line has dissipated a sufficient amount. At time t6, the selected word line will be lowered to Vss and the unselected word lines will be lowered to Vdd.

If there are to be multiple reads (e.g., multi-state memory cell), then at time t7 operation continues at t2. If not, then the recovery phase takes place between times t7 and t8. At time t7, SGD is brought down to Vss, the unselected word lines (WL_unsel) are brought down to Vss, SGS is brought down to Vss, and the bit line is completely dissipated to Vss. At time t8, the system enters standby mode, at which time all signals depicted in FIG. 12 are at Vss.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:
1. A method for using non-volatile storage, comprising:
raising a control gate voltage for an unselected non-volatile storage element from an intermediate voltage to a read enable voltage;
raising a control gate voltage for a selected non-volatile storage element from a standby voltage to a read voltage while raising said control gate voltage for said unselected non-volatile storage element from said interme- diate voltage to said read enable voltage, said standby voltage is lower than said intermediate voltage; and
sensing information about data stored in said selected non-volatile storage element in response to said read voltage.

2. A method according to claim 1, wherein:
a read process is associated with a setup phase, a data access phase and a recovery phase;
said raising a control gate voltage for an unselected non-volatile storage element, said raising a control gate voltage for a selected non-volatile storage element and said sensing information are part of said data access phase;
said method further comprises changing said control gate voltage for said unselected non-volatile storage element to said intermediate voltage during said setup phase and changing said control gate voltage for a selected non-volatile storage element to a standby voltage from said read voltage during said recovery phase.

3. A method according to claim 1, further comprising:
raising said control gate voltage for said unselected non-volatile storage element from said standby voltage to said intermediate voltage.

4. A method according to claim 1, further comprising:
raising said control gate voltage for said unselected non-volatile storage element from said standby voltage to said intermediate voltage while said control gate voltage for said selected non-volatile storage element is at said standby voltage.

5. A method according to claim 1, wherein:
said method includes programming said selected non-volatile storage element, including applying a boosting voltage as said control gate voltage for said unselected non-volatile storage element;
said raising a control gate voltage for an unselected non-volatile storage element, said raising a control gate voltage for a selected non-volatile storage element and said sensing information are performed as part of a verify operation for said programming; and
said method further includes transitioning from said programming to said verify operation by changing said control gate voltage for said unselected non-volatile storage element to said intermediate voltage for a period of time during which said control gate voltage for said selected non-volatile storage element is at said standby voltage.

6. A method according to claim 1, wherein:
said unselected non-volatile storage element and said selected non-volatile storage element are NAND flash memory devices.

7. A method according to claim 1, wherein:
said unselected non-volatile storage element and said selected non-volatile storage element are multi-state flash memory devices.

8. A method according to claim 1, wherein:
said intermediate voltage is a power supply voltage.

9. A method for using non-volatile storage, comprising:
changing a set of one or more unselected word lines for a set of non-volatile storage elements to a first voltage level and holding said unselected word lines at said first voltage level for a first period of time;
raising said set of unselected word lines from said first voltage level to a second voltage level and holding said unselected word lines at said second voltage level for a second period of time;
raising a selected word line from a standby voltage to a read voltage level while raising said set of unselected word lines from said first voltage level to said second voltage level, wherein said standby voltage is lower than said first voltage level said selected word line is associated with a selected non-volatile storage element; and
sensing information about data stored in said selected non-volatile storage element in response to said read voltage level.

10. A method according to claim 9, wherein said raising a selected word line to a read voltage level while raising said set of unselected word lines from said first voltage level to said second voltage level includes raising said selected word line from a standby voltage to said read voltage level while raising said set of unselected word lines from said first voltage level to said second voltage level.

11. A method according to claim 10, wherein said changing a set of one or more unselected word lines for a set of non-volatile storage elements to a first voltage level includes changing said set of unselected word lines to a power supply voltage level.

12. A method according to claim 11, wherein said second voltage level is a read enable voltage level.

13. A method according to claim 9, wherein:
a read process is associated with a setup phase and a data access phase;
said changing a set of one or more unselected word lines for a set of non-volatile storage elements to a first voltage level and holding said unselected word lines at said first voltage level for a first period of time is part of said setup phase; and
said raising said set of unselected word lines from said first voltage level to a second voltage level and said raising a selected word line to a read voltage level while raising said set of unselected word lines from said first voltage level to said second voltage level are part of said data access phase.

14. A method according to claim 9, wherein said changing a set of one or more unselected word lines for a set of non-volatile storage elements to a first voltage level and holding said unselected word lines at said first voltage level for a first period of time includes changing the set of one or more word lines from a standby voltage to said first voltage level while a voltage level for said selected word line is held at said standby voltage.

15. A method according to claim 9, further comprising:
programming said selected non-volatile storage element while said unselected word lines receive a boosting voltage and said selected word line receives a program voltage;
said changing a set of one or more unselected word lines, said raising said set of unselected word lines from said first voltage level to a second voltage level, said raising a selected word line to a read voltage level while raising said set of unselected word lines from said first voltage level to said second voltage level, and said sensing information are performed as part of a verify operation for said programming; and
transitioning from said programming to said verify operation by changing said unselected word lines from said boosting voltage to said first voltage level and changing said selected word line from said program voltage to a standby voltage that is lower than said first voltage level.

16. A method according to claim 9, wherein said sensing information about data stored in said selected non-volatile storage element in response to said read voltage level includes:
waiting for said selected word line to settle;
pre-charging a bit line associated with said selected non-volatile storage element;

providing a discharge path for said bit line; and
determining whether said bit line discharges.

17. A method according to claim 16, wherein:
said first voltage level is a power supply voltage level;
said set of non-volatile storage elements are arranged in NAND strings connected to said selected word line and said unselected word lines;
one of said NAND strings is connected to said bit line and includes said selected non-volatile storage element; and
said first selected non-volatile storage element is connected to said selected word line.

18. A method according to claim 16, wherein:
said steps of pre-charging and determining are part of a verify process.

19. A method according to claim 16, wherein:
said steps of pre-charging and determining are part of a read process.

20. A method according to claim 16, further comprising:
reporting data based on whether said bit line discharges.

* * * * *